(12) United States Patent
Ahn

(10) Patent No.: US 9,989,208 B2
(45) Date of Patent: Jun. 5, 2018

(54) LIGHT EMITTING APPARATUS FOR VEHICLE

(71) Applicant: Hyundai Motor Company, Seoul (KR)

(72) Inventor: Byoung Suk Ahn, Whasung-Si (KR)

(73) Assignee: Hyundai Motor Company, Seoul (KR)

( * ) Notice: Subject to any disclaimer, the term of this patent is extended or adjusted under 35 U.S.C. 154(b) by 293 days.

(21) Appl. No.: 14/807,096

(22) Filed: Jul. 23, 2015

(65) Prior Publication Data

US 2016/0258587 A1    Sep. 8, 2016

(30) Foreign Application Priority Data

Mar. 5, 2015    (KR) .................. 10-2015-0030930

(51) Int. Cl.

| | |
|---|---|
| *F21V 9/00* | (2018.01) |
| *F21S 8/10* | (2006.01) |
| *F21V 5/00* | (2018.01) |
| *F21V 7/04* | (2006.01) |
| *F21V 9/16* | (2006.01) |
| *G02B 27/09* | (2006.01) |
| *H01S 5/022* | (2006.01) |
| *F21Y 115/30* | (2016.01) |
| *F21Y 115/10* | (2016.01) |

(52) U.S. Cl.
CPC ............. *F21S 48/00* (2013.01); *F21S 48/115* (2013.01); *F21S 48/1145* (2013.01); *F21S 48/1225* (2013.01); *F21S 48/1241* (2013.01); *F21V 5/00* (2013.01); *F21V 7/043* (2013.01); *F21V 9/16* (2013.01); *G02B 27/0916* (2013.01); *H01S 5/022* (2013.01); *F21Y 2115/10* (2016.08); *F21Y 2115/30* (2016.08)

(58) Field of Classification Search
CPC ........... F21V 7/043; F21V 9/16; F21V 3/0445
USPC ...................................................... 362/553
See application file for complete search history.

(56) References Cited

U.S. PATENT DOCUMENTS 4,693,758 A * 9/1987 Kobayashi ............ H01L 21/268
                                                                    117/43
6,698,891 B2 * 3/2004 Kato .................. G02B 27/0994
                                                                    353/20

(Continued)

FOREIGN PATENT DOCUMENTS

| JP | 2005-228502 A | 8/2005 |
| JP | 2014-232734 A | 12/2014 |

(Continued)

*Primary Examiner* — Julie Bannan
(74) *Attorney, Agent, or Firm* — Morgan, Lewis & Bockius LLP

(57) ABSTRACT

A light emitting apparatus for a vehicle includes a light source, a diffuser and a beam guider. The light source emits light having a beam pattern with a first imaginary line starting from a center of the beam pattern and extending to a perimeter of the beam pattern and a second imaginary line starting from the center of the beam pattern and extending to the perimeter of the beam pattern at a preset angle relative to the first imaginary line. The first and second imaginary lines have lengths different from each other. The diffuser receives the light of the light source and diffuses the received light to reduce the difference between the lengths of the first and second imaginary lines. The beam guider guides the diffused light along a path to produce an outlet light within a preset range.

8 Claims, 7 Drawing Sheets

(56) References Cited

U.S. PATENT DOCUMENTS

| | | | | |
|---|---|---|---|---|
| 7,510,316 | B2* | 3/2009 | De Vaan | G02B 6/0033 |
| | | | | 362/606 |
| 8,393,753 | B2* | 3/2013 | Allegri | F21V 5/002 |
| | | | | 362/224 |
| 8,636,366 | B2* | 1/2014 | Kato | G02B 27/0994 |
| | | | | 353/33 |
| 9,234,645 | B2* | 1/2016 | Min | F21V 7/0025 |
| 2002/0141197 | A1* | 10/2002 | Petroski | F21L 4/027 |
| | | | | 362/373 |
| 2005/0270776 | A1* | 12/2005 | Allen | G01J 1/08 |
| | | | | 362/241 |
| 2009/0162667 | A1* | 6/2009 | Radkov | G02F 1/133617 |
| | | | | 428/426 |
| 2010/0172120 | A1* | 7/2010 | Wegh | F21S 10/02 |
| | | | | 362/84 |
| 2010/0328925 | A1* | 12/2010 | Hoelen | F21V 14/08 |
| | | | | 362/84 |
| 2012/0140435 | A1* | 6/2012 | Li | G09F 13/20 |
| | | | | 362/84 |
| 2014/0301098 | A1 | 10/2014 | Lai | |
| 2015/0009682 | A1* | 1/2015 | Clough | F21V 13/02 |
| | | | | 362/311.02 |

FOREIGN PATENT DOCUMENTS

| | | |
|---|---|---|
| KR | 10-2005-0046201 A | 5/2005 |
| KR | 10-1461565 B1 | 11/2014 |

\* cited by examiner

LIGHT EMITTING APPARATUS FOR VEHICLE

CROSS-REFERENCE TO RELATED APPLICATION

The present application claims priority of Korean Patent Application Number 10-2015-0030930 filed on Mar. 5, 2015, the entire contents of which application are incorporated herein for all purposes by this reference.

BACKGROUND OF INVENTION

Field of Invention

The present disclosure relates to a light emitting apparatus for a vehicle. More particularly, it relates to a light emitting apparatus for a vehicle that diffuses the light from a light source and produces a more evenly or uniformly distributed light.

Background Art

Recently, a variety of researches and changes are made about the illumination apparatus for a vehicle. The changes are made not only about the exterior design of the lamp but also about the entire lamp including the interior reflector. These changes include the variations of the light emitting apparatus of the lamp, that is, according to a related art, a light generation method using a simple electric bulb is used, however, recently, light emitting apparatuses using a variety of light sources such as the laser, LED or the like are being developed. In case of the laser among these, since the high density energy can be generated so that there is an advantage of capable of irradiating a comparatively far distance, the development is more vigorously performed.

In general, in case of using only one laser, the amount of light is insufficient, so plural lasers are used and lights are superimposed. However, in this case, there occurs a collection of the light of the laser and thus there arises a problem in that the energy is not uniformly distributed.

Specifically describing this by referring to FIGS. 1A and 1B which are views illustrating a conventional light emitting apparatus using a laser, where FIG. 1A is a view illustrating the energy distributions with each laser, and FIG. 1B is a view illustrating a superimposed shape of lasers and an energy distribution thereof. Since the laser diode, due to the property of the laser, forms a beam pattern in a form of an elliptic shape in which the energy is concentrated more at the center and irradiates light when using three or plural laser diodes, the light is superimposed only on the center as shown in FIG. 1B. This means that the energy is collected on the center and is not uniformly distributed over an entire irradiation area of the beam pattern as shown in the graphs. If the energy is not uniformly distributed, then the inefficiency in using the energy is caused, and the degradation of the fluorescent body which changes the wavelength of the laser is accelerated, and further it even causes a problem of inducing the functional damage or destruction of the fluorescent body. Therefore, a light emitting apparatus is required in which a plurality of light sources form a superimposition of the beam patterns matching each other.

The information disclosed in this Background section is only for enhancement of understanding of the general background of the invention and should not be taken as an acknowledgement or any form of suggestion that this information forms the prior art already known to a person skilled in the art.

SUMMARY OF INVENTION

The present invention has been made in an effort to solve the above-described problems associated with prior art and/ or other problems. One object of the present invention is to provide a light emitting apparatus for a vehicle which may accomplish a matching of the beam patterns even if the plural light sources are irradiated at various angles so that the beam patterns are superimposed.

In one aspect, a light emitting apparatus for vehicle according to the present invention comprises: a light source for emitting light having a beam pattern with a first imaginary line and a second imaginary line, wherein the first imaginary line starts from a center of the beam pattern and extends to a perimeter of the beam pattern, the second imaginary line starts from the center of the beam pattern and extends to the perimeter of the beam pattern at a preset angle relative to the first imaginary line, and the first and second imaginary lines have lengths different from each other; a diffuser for receiving the light of the light source and diffusing the received light to reduce the difference between the lengths of the first imaginary line and the second imaginary line; and a beam guider for guiding the diffused light along a path to produce an outlet light within a preset range.

In a preferred embodiment, the beam pattern may be formed such that the length of the second imaginary line is shorter than the length of the first imaginary line, and the diffuser may reduce the difference between the lengths of the second imaginary line and the first imaginary line by increasing the length of the second imaginary line.

In another preferred embodiment, the beam pattern may have a plurality of imaginary lines, and the first imaginary line may be the longest among the plurality of imaginary lines.

In still another preferred embodiment, the diffuser may diffuse the beam pattern so that the length of the second imaginary line becomes substantially the same as that of the first imaginary line.

In yet another preferred embodiment, the diffused light may have a beam pattern in a substantially circular shape with the first imaginary line as a radius.

In still yet another preferred embodiment, a conduit line may be formed in the beam guider, through which the light travels, and a reflector may be provided in the beam guider to reflect and guide the light incident into the conduit line.

In still yet another preferred embodiment, the beam guider may have a substantially cylindrical shape, and one end of the beam guider may face the diffuser.

In still yet another preferred embodiment, the light source may generate a laser beam, and a fluorescent body may be provided at an outlet of the beam guider for producing the outlet light at a wavelength different than a wavelength of the laser beam.

Other aspects and preferred embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

The information disclosed in this Background section is only for enhancement of understanding of the general background of the invention and should not be taken as an acknowledgement or any form of suggestion that this information forms the prior art already known to a person skilled in the art.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1A:
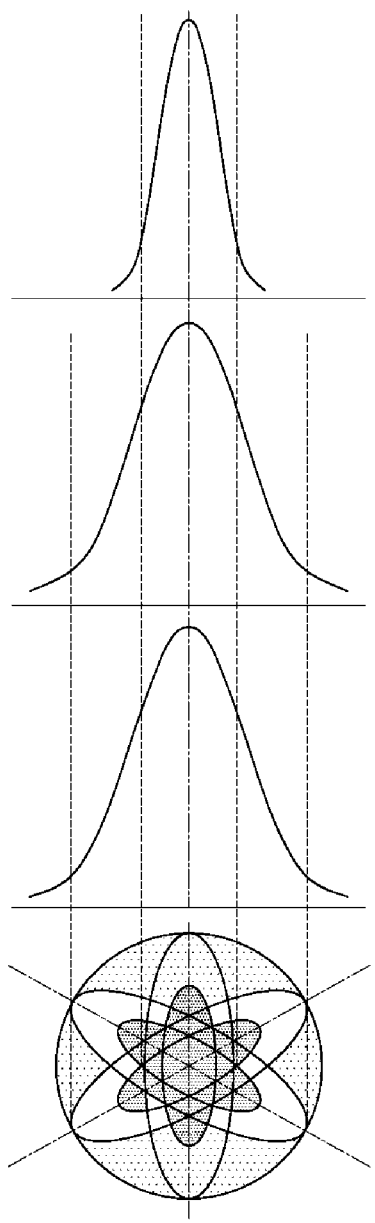
FIG. 1A and FIG. 1B are views illustrating a conventional light emitting apparatus using a laser.
Figure 1B:
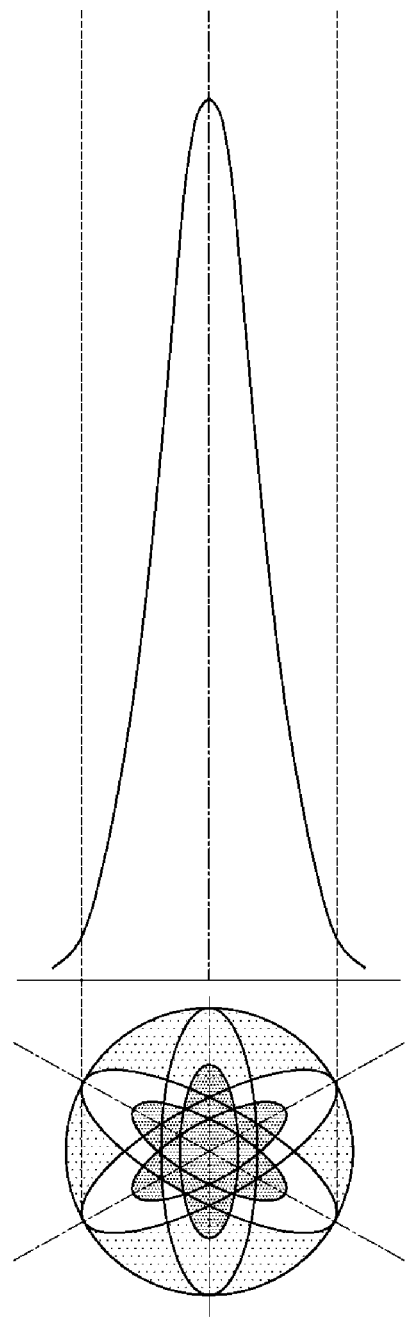

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereafter, a light emitting apparatus for a vehicle according to some embodiments of the present invention will be described by referring to the accompanying drawings.

Figure 2:
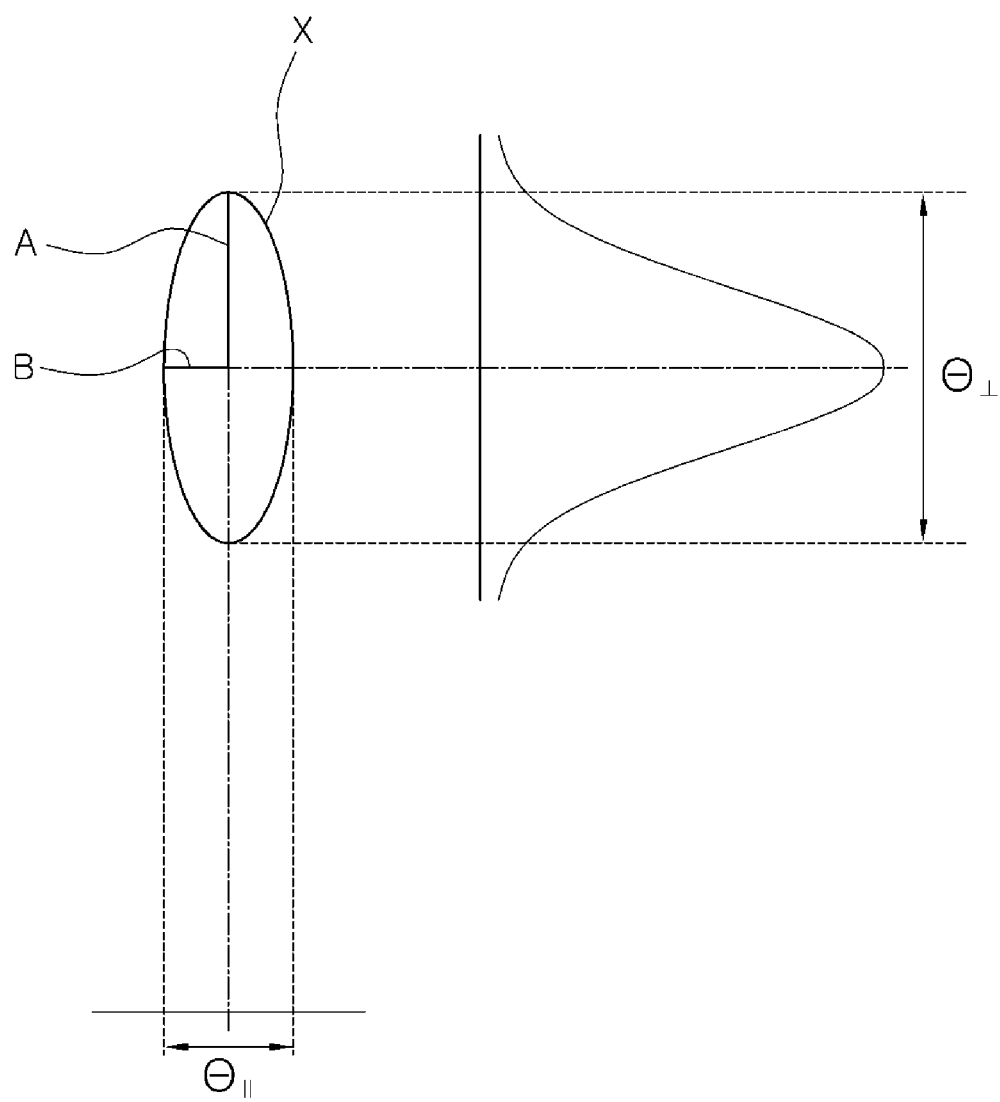
FIG. 2 is a view illustrating an exemplary first imaginary line and an exemplary second imaginary line of a beam pattern according to the present invention.
Figure 3:
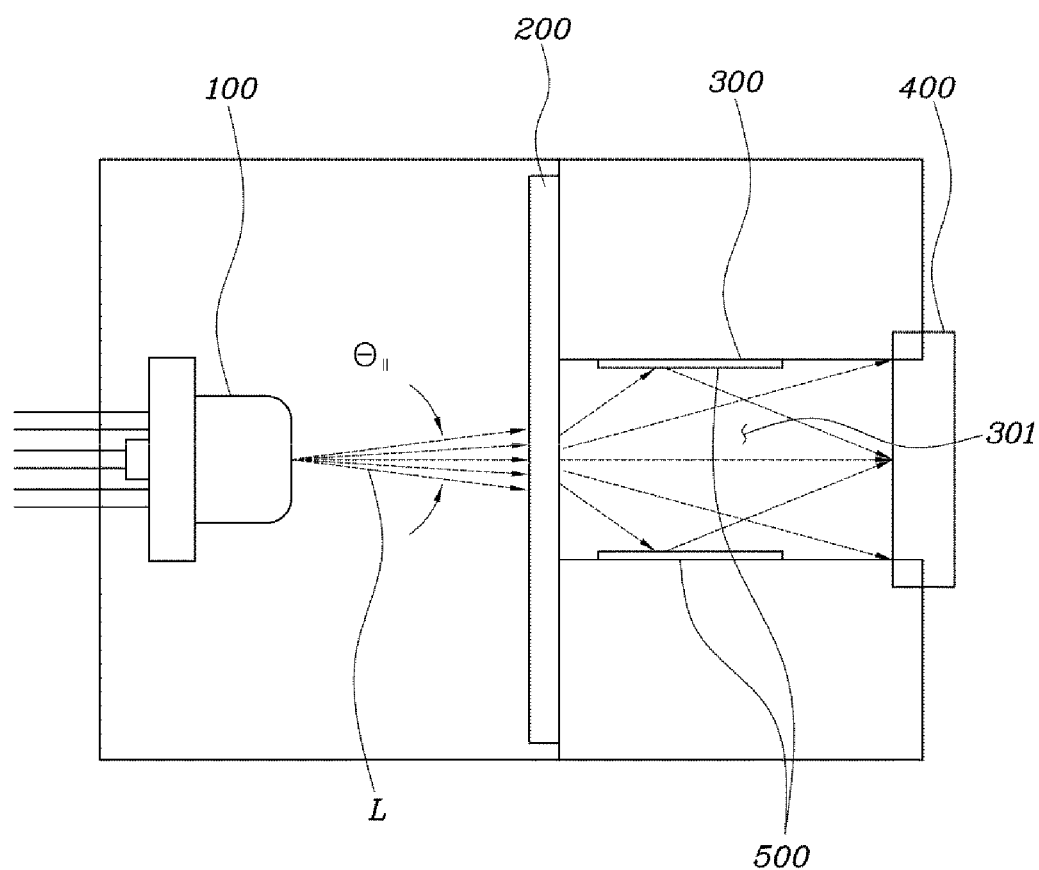
FIG. 3 and FIG. 4 are views illustrating an exemplary light emitting apparatus for a vehicle according to the present invention.
Figure 4:
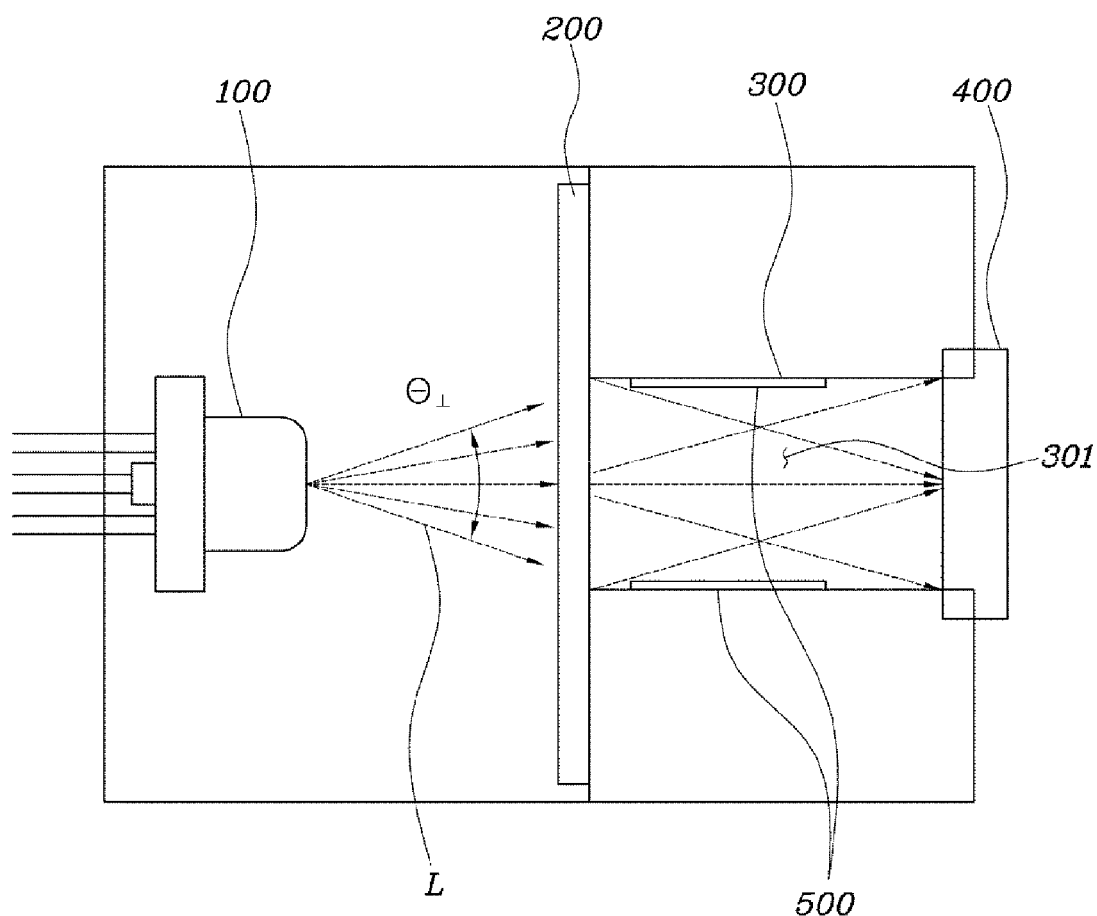

FIG. 2 is a view illustrating a first imaginary line and a second imaginary line of a beam pattern according to some embodiments of the present invention. FIGS. 3 and 4 are views illustrating a light emitting apparatus for a vehicle according to some embodiments of the present invention. The light emitting apparatus for a vehicle according to some embodiments of the present invention may include: a light source 100 for forming a beam pattern in such a way that when a first imaginary line A leading from a center of the beam pattern X to a perimeter of the beam pattern X and a second imaginary line B having a preset angle relative to the first imaginary line A are set, the imaginary lines A and B have lengths different from each other; a diffuser 200 for receiving light of the light source 100 and diffusing the received light so as to decrease the difference in the lengths of the first imaginary line A and the second imaginary line B; and a beam guider 300 for guiding a path of travel of the light to collect the diffused light within a preset range.

Specifically, the light source 100 may have a beam pattern shape of an irregular polygon or an elliptic shape, and preferably may have a beam pattern shape of an elliptic shape. Of course, the beam pattern shape is not necessarily limited to these shapes but may have a variety of shapes.

The first imaginary line A may have the largest length among plural imaginary lines which may lead from the center of the beam pattern X to the perimeter thereof, and the second imaginary line B may be formed to be shorter than the first imaginary line A, and the diffuser 200 may reduce the difference between the lengths of the second imaginary line B and the first imaginary line A by increasing the length of the second imaginary line B.

Herein, the second imaginary line B refers to a single imaginary line or a plurality of imaginary lines having lengths shorter than the first imaginary line A. By way of illustration, FIG. 2 shows the second imaginary line B having one imaginary line. Through the diffuser 200, the lengths of the second imaginary line B (e.g., at least one imaginary line or all imaginary lines in the plurality of imaginary lines having shorter lengths than the first imaginary line A) may be increased, reducing the difference between the lengths of the second imaginary line B and the length of the first imaginary line A. To this end, it is preferable that a plurality of diffusing patterns are formed at the diffuser 200 so as to be able to diffuse the light. For example, the diffuser 200 may be a diffusing lens or an optic and the like.

As a further preferable embodiment, the diffuser 200 may diffuse the beam pattern X so that the length of the second imaginary line B becomes the same or substantially the same as that of the first imaginary line A, and the diffused beam pattern X may be formed to have a circular shape having the first imaginary line A as a radius.

The diffusing pattern of the diffuser 200 may be set in a variety of forms such that the beam pattern X may have a circular shape, and the diffusing pattern at a place corresponding to the first imaginary line A may be formed to be different from those at remaining places. For example, since the first imaginary line A has to be prevented from diffusing and at least one of the second imaginary lines B has to be diffused to change the elliptic shape to the circular shape, the diffusing patterns different from each other may be formed according to each preset place.

By making a width of the beam pattern X be maximum length entirely and uniformly as described herein, the energy is not concentrated at a place but distributed uniformly in a preset range when compared to the beam pattern X having the circular shape or the irregular polygon shape.

FIG. 3 is a view illustrating an exemplary light emitting apparatus of the present application viewed in the Θ∥ direction of FIG. 2 and FIG. 4 is a view illustrating the exemplary light emitting apparatus of the present application viewed in the Θ⊥ direction of FIG. 2. As shown, in some embodiments, a conduit or conduit line 301 is formed in the beam guider 300, through which the light travels, and a reflector 500 is provided in the conduit line to guide the movement of the light L incident into the conduit line 301. The beam guider 300 may be a pipe of a cylindrical or substantially cylindrical shape or a structural body formed with the conduit line 301.

One end of the beam guider 300 is configured to face the diffuser 200, so that light L of the light source which has passed the diffuser 200 may be output to the outside along the beam guider 300. A width of the beam guider 300 is preferably formed to have a size corresponding to the maximum length of the beam pattern X before received by the diffuser 200 so that the light L generated at the light source 100 is entirely received, and the reflector 500 in the beam guider 300 may be installed partly along the length of the beam guider 300 or may be provided to cover all the wall of the conduit line 301. A variety of embodiments, for example, a mirror or a reflecting coating may be applied to the installation of the reflector 500.

Meanwhile, a variety of light sources may be used for the light source 100, and preferably the laser diode may be used. Since if the laser is directly irradiated to the eyes of human being, there is a risk of causing blindness in view of the property of the laser, it is preferable to prevent damage to the eyes of human being by producing an outlet light at a wavelength different than a wavelength of the laser beam. Therefore, in some embodiments, a fluorescent body 400 may be provided at the outlet of the beam guider 300 to produce the outlet light at a wavelength different than a wavelength of the laser beam. The fluorescent body 400 may be configured to cover the entire outlet of the beam guider 300 to ensure the laser beam passing through the fluorescent body 400 and irradiated.

Of course, in a case where LED other than the laser diode or a light emitting source of other types is used for the light source 100, the fluorescent body 400 is not a necessity and may be removed.

Figure 5:
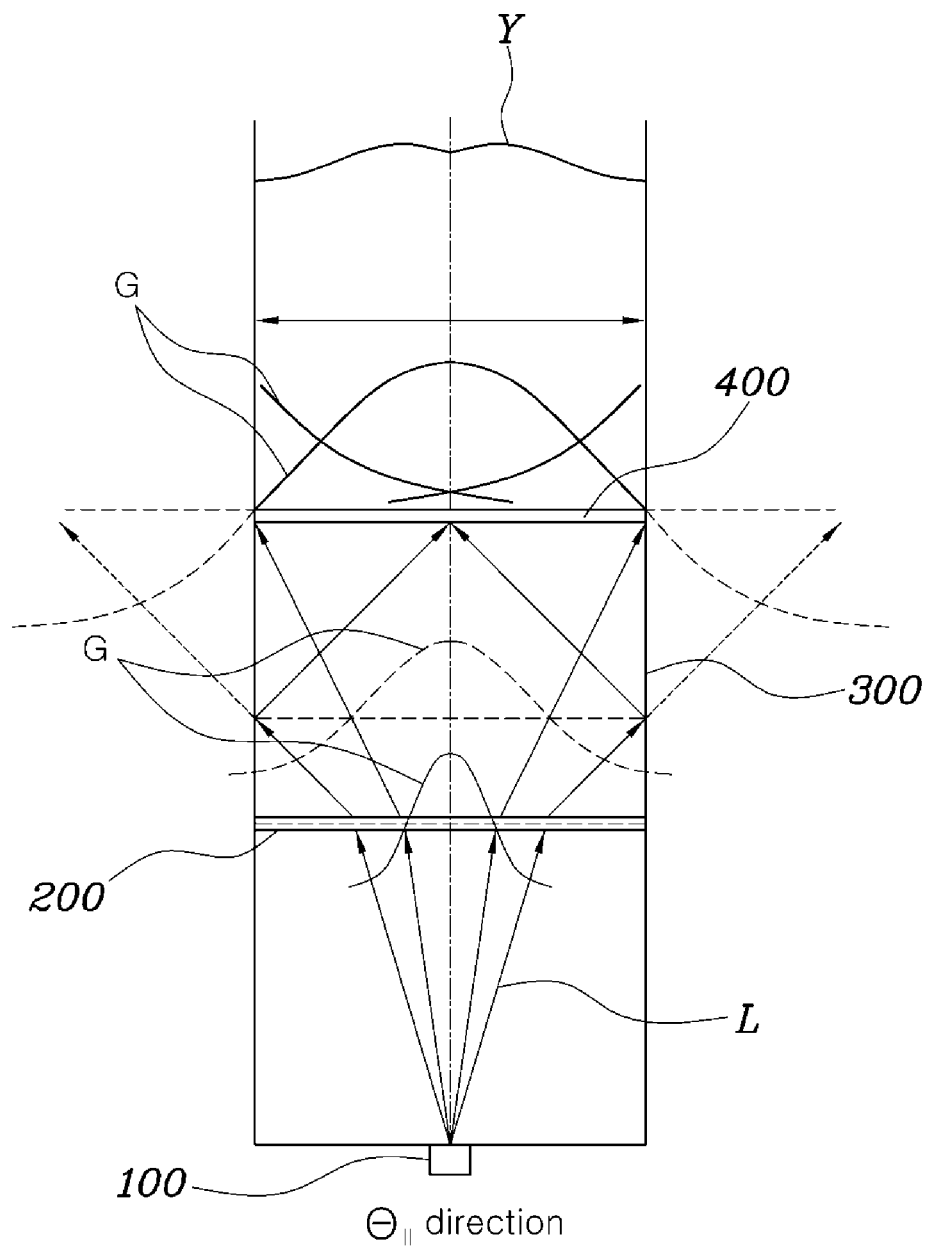
FIG. 5 and FIG. 6 are views illustrating an energy distribution of an exemplary light emitting apparatus for a vehicle according to the present invention.
Figure 6:
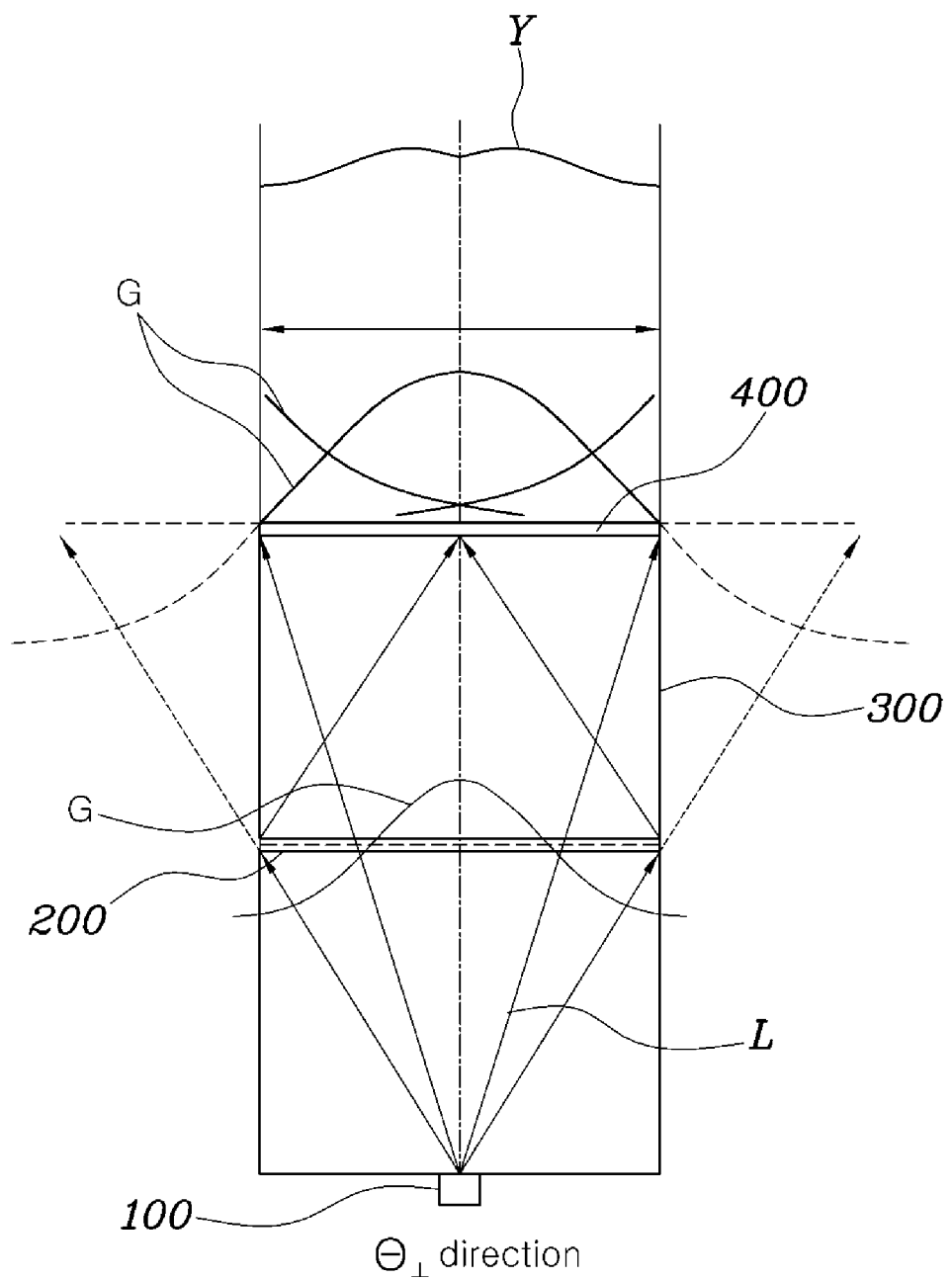

According to the present invention described herein, FIGS. 5 and 6 are views illustrating an energy distribution of the light emitting apparatus for a vehicle according to some embodiments of the present invention. FIG. 5 is a view illustrating an energy distribution viewed in the Θ∥ direction of FIG. 2 and FIG. 6 is a view illustrating an energy distribution viewed in the Θ⊥ direction of FIG. 2. FIGS. 5 and 6 show the light energy distributions at various locations, where Y indicates the energy distribution of the finally output light.

The Θ⊥ direction of FIG. 2 is a direction viewing in such a way that the first imaginary line becomes the radius, and the Θ∥ direction of FIG. 2 is a direction viewing in such a way that the imaginary line having the minimum length among the imaginary lines becomes the radius. As can be seen in FIGS. 5 and 6, energy distributions at different locations are different from each other. The beam pattern X at the finally output is more evenly distributed. In particular, the light L of the light source incident into the conduit line 301 is reflected by the reflector 500 provided in the beam guider 300 such that the energy is uniformly output through the perimeter and the center of the outlet of the beam guider 300 as shown by Y, thus the energy is prevented from being concentrated only at the center and may be more evenly or uniformly distributed over the entire area of the outlet.

According to the light emitting apparatus for a vehicle of the present invention, the energy distributions of the finally output beam patterns become uniform (or more evenly distributed) to give the uniformly distributed energy distribution even when the beam patterns are superimposed.

Furthermore, according to the light emitting apparatus for a vehicle of the present invention, the excessive energy concentrating at a certain place may be prevented to prevent the deformation or damage to the center of the light receiving surface.

In addition, according to the light emitting apparatus for a vehicle of the present invention, a uniform color feeling may be kept by reducing the occurrence of the chromatic aberration according to the difference in the energy density of the center and the perimeter.

In addition, the occurrence of the chromatic aberration according to the difference in the energy density of the center and the perimeter may be reduced.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A light emitting apparatus for a vehicle comprising:
a light source emitting a laser beam, which forms a beam pattern in a form of an elliptic shape, a diffuser disposed in front of the light source, and a beam guider disposed in front of the diffuser and having a conduit through which the light travels and a reflector provided in the beam guider to reflect and guide the light incident into a conduit line, wherein the light source emits light having the beam pattern with a first imaginary line and a second imaginary line,
wherein the first imaginary line starts from a center of the beam pattern and extends to a perimeter of the beam pattern,
wherein the second imaginary line starts from the center of the beam pattern and extends to the perimeter of the beam pattern at a preset angle relative to the first imaginary line, and
wherein the first and second imaginary lines have lengths different from each other;
wherein the diffuser receives the emitted light of the light source and diffuses the received light to reduce a difference between the lengths of the first imaginary line and the second imaginary line,
wherein the beam guider guides the diffused light along a path to produce an outlet light within a preset range, and
wherein a first end of the beam guider is connected to the diffuser and a second end of the beam guider is an outlet for producing an outlet light, thereby the beam pattern of the light source is formed such that the length of the second imaginary line is shorter than the length of the first imaginary line, and the diffuser reduces the difference between the lengths of the second imaginary line and the first imaginary line by increasing the length of the second imaginary line, and also the diffused light has the beam pattern in a substantially circular shape with the first imaginary line as a radius.

2. The light emitting apparatus for vehicle of claim 1, wherein the beam pattern has a plurality of imaginary lines, and the first imaginary line is the longest among the plurality of imaginary lines.

3. The light emitting apparatus for vehicle of claim 1, wherein the length of the second imaginary line is increased to be substantially equal to the length of the first imaginary line by the diffuser.

4. The light emitting apparatus for vehicle of claim 1, wherein the beam guider has a substantially cylindrical shape.

5. The light emitting apparatus for vehicle of claim 1, further comprising:
   a fluorescent body provided at an outlet of the beam guider for producing the outlet light at a wavelength different than a wavelength of the laser beam.

6. The light emitting apparatus for vehicle of claim 1, wherein the laser beam generated by the light source passes through the diffuser.

7. The light emitting apparatus for vehicle of claim 1, wherein the beam guider is disposed perpendicular to the diffuser.

8. The light emitting apparatus for vehicle of claim 1, wherein the diffuser is disposed perpendicular to an axial direction of the light source.

\* \* \* \* \*